(12) United States Patent
Chung et al.

(10) Patent No.: US 12,713,987 B2
(45) Date of Patent: Aug. 18, 2026

(54) SEMICONDUCTOR PACKAGE

(71) Applicant: Samsung Electronics Co., Ltd., Suwon-si (KR)

(72) Inventors: Hyun Soo Chung, Suwon-si (KR); Won-Young Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 329 days.

(21) Appl. No.: 18/341,381

(22) Filed: Jun. 26, 2023

(65) Prior Publication Data

US 2024/0021575 A1 Jan. 18, 2024

(30) Foreign Application Priority Data

Jul. 14, 2022 (KR) ........................ 10-2022-0087132

(51) Int. Cl.

| | |
|---|---|
| ***H01L 25/065*** | (2023.01) |
| ***H10W 20/20*** | (2026.01) |
| ***H10W 40/00*** | (2026.01) |
| ***H10W 70/60*** | (2026.01) |
| ***H10W 70/685*** | (2026.01) |
| ***H10W 74/10*** | (2026.01) |
| ***H10W 90/00*** | (2026.01) |
| *H10B 80/00* | (2023.01) |
| *H10W 74/15* | (2026.01) |

(52) U.S. Cl.

CPC ........... *H10W 90/00* (2026.01); *H10W 20/20* (2026.01); *H10W 40/00* (2026.01); *H10W 70/611* (2026.01); *H10W 70/685* (2026.01); *H10W 74/117* (2026.01); *H10W 74/131* (2026.01); *H10W 90/401* (2026.01); *H10B 80/00* (2023.02); *H10W 74/15* (2026.01); *H10W 90/722* (2026.01); *H10W 90/724* (2026.01); *H10W 90/732* (2026.01); *H10W 90/734* (2026.01)

(58) Field of Classification Search

CPC ............. H01L 25/0652; H01L 23/3128; H01L 23/3157; H10W 90/00; H10W 70/685; H10W 40/00; H10W 20/20; H10W 74/131

USPC .......................................................... 257/668

See application file for complete search history.

(56) References Cited

U.S. PATENT DOCUMENTS

| | | | |
|---|---|---|---|
| 9,461,018 | B1 | 10/2016 | Tsai et al. |
| 10,153,222 | B2 | 12/2018 | Yu et al. |
| 10,522,449 | B2 | 12/2019 | Chen et al. |
| 10,741,512 | B2 | 8/2020 | Wu et al. |
| 10,854,551 | B2 | 12/2020 | Yu et al. |
| 11,244,939 | B2 | 2/2022 | Tsai et al. |
| 11,282,816 | B2 | 3/2022 | Yu et al. |

(Continued)

*Primary Examiner* — Dzung Tran

(74) *Attorney, Agent, or Firm* — Harness, Dickey & Pierce, P.L.C.

(57) ABSTRACT

A semiconductor package including a buffer structure including a first redistribution layer, a first buffer chip on the first redistribution layer, a second redistribution layer on the first buffer chip, and a first molding layer filling between the first redistribution layer and the second redistribution layer, and a first chip stack and a first semiconductor chip on the buffer structure and spaced apart from each other, wherein the first buffer chip overlaps at least a portion of the first semiconductor chip in a first direction from the buffer structure toward the first semiconductor chip, may be provided.

20 Claims, 12 Drawing Sheets

(56) References Cited

U.S. PATENT DOCUMENTS

2016/0035711 A1* 2/2016 Hu .......................... H01L 25/18
257/686
2018/0138101 A1* 5/2018 Yu ......................... H01L 23/481
2020/0168550 A1* 5/2020 Ryu .................... H01L 23/5384
2021/0118858 A1* 4/2021 Yu ........................... H01L 24/80
2021/0143143 A1 5/2021 Yu et al.
2021/0351159 A1 11/2021 Delacruz et al.

* cited by examiner

FIG. 5

SEMICONDUCTOR PACKAGE

CROSS-REFERENCE TO RELATED APPLICATION

This application claims priority from Korean Patent Application No. 10-2022-0087132 filed on Jul. 14, 2022 in the Korean Intellectual Property Office, and all the benefits accruing therefrom under 35 U.S.C. 119, the contents of which in their entirety are herein incorporated by reference.

BACKGROUND

1. Technical Field

The present disclosure relates to semiconductor packages.

2. Description of the Related Art

With the development of electronic industry, electronic devices are miniaturized even more and can be more prone to multi-functions. Therefore, demand for an increase in capacity and speed of memory used in the electronic devices also increases. Accordingly, various techniques have been proposed to increase the capacity of memory while miniaturizing a semiconductor package and increasing the driving speed of the memory.

Thus, system-in-package (SIP) techniques that embed semiconductor memory devices into a single package structure so that one semiconductor package product can operate faster, process larger capacity data, and perform multi-functions are attracting attention. In addition, high bandwidth memory (HBM) techniques that realize larger capacity memory by vertically stacking a plurality of semiconductor chips using through silicon via (TSV) techniques have been proposed.

HBM has a structure in which semiconductor chips vertically stacked are connected to each other using a TSV and connected to a processor through silicon interposers positioned below the semiconductor chips. The lowermost semiconductor chip among the vertically stacked semiconductor chips is a buffer chip, which may communicate with a processor to transmit and receive data or receive various control signals and voltage signals. The semiconductor chips stacked on the buffer chip may be memory chips, which may store data received through the buffer chip. A plurality of memory chips are stacked on the buffer chip, and generally has a smaller size than the buffer chip.

SUMMARY

Some aspects of the present disclosure provide semiconductor packages with improved data processing speed.

Some aspects of the present disclosure also provide semiconductor packages in which the size of a buffer chip is not limited.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a semiconductor package includes a buffer structure, which includes a first redistribution layer, a first buffer chip on the first redistribution layer, a second redistribution layer on the first buffer chip, and a first molding layer filling between the first redistribution layer and the second redistribution layer, and a first chip stack and a first semiconductor chip that are on the buffer structure and spaced apart from each other, wherein the first buffer chip overlaps at least a portion of the first semiconductor chip in a first direction from the buffer structure toward the first semiconductor chip.

According to another aspect of the present disclosure, a semiconductor package includes a buffer chip including a buffer substrate including a first surface and a second surface, the buffer chip including a semiconductor element layer on the first surface of the buffer substrate, the first surface and the second surface being opposed to each other in a first direction, a first redistribution layer on the semiconductor element layer, a second redistribution layer on the second surface of the buffer substrate, a first molding layer filling between the first redistribution layer and the second redistribution layer, and a chip stack and a first semiconductor chip spaced apart from each other on the first redistribution layer.

According to another aspect of the present disclosure, a semiconductor package includes a package substrate, a first redistribution layer on the package substrate, a buffer chip on the first redistribution layer, the buffer chip including a buffer substrate having a first surface and a second surface, and the buffer chip including a semiconductor element layer on the second surface of the buffer substrate, the semiconductor element layer including a first physical region, the first surface and the second surface being opposed to each other in a first direction, a second redistribution layer on the semiconductor element layer, a first molding layer filling between the first redistribution layer and the second redistribution layer, a first pillar penetrating through the first molding layer and electrically connecting the buffer chip to the second redistribution layer, a second pillar penetrating through the first molding layer, the second pillar connecting the first redistribution layer to the second redistribution layer, a first semiconductor chip on the second redistribution layer, the first semiconductor chip including a second physical region, a chip stack on the second redistribution layer, the chip stack spaced apart from the first semiconductor chip, and a second molding layer on the second redistribution layer, the second molding layer configured to cover at least portions of the chip stack and the first semiconductor chip, wherein the first physical region overlaps at least a portion of the second physical region in the first direction and the semiconductor package is configured to transmit and receive a signal between the buffer chip and the first semiconductor chip through the first physical region and the second physical region.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail some example embodiments thereof with reference to the attached drawings, in which:

FIGS. 3 to 5 are views of a semiconductor package according to some example embodiments;

DETAILED DESCRIPTION

Hereinafter, some example embodiments of the present disclosure will be described with reference to the attached drawings.

As used herein, expressions such as "at least one of," when preceding a list of elements, modify the entire list of elements and do not modify the individual elements of the list. Thus, for example, both "at least one of A, B, or C" and "A, B, and C" mean either A, B, C or any combination thereof.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
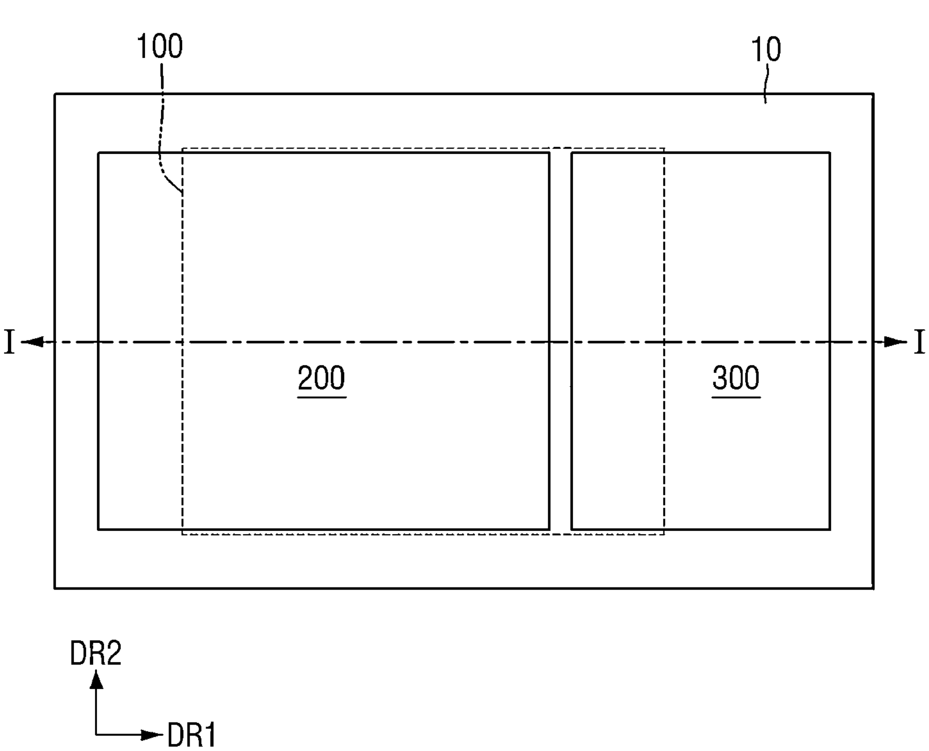
FIG. 1 is a plan view of a semiconductor package according to an example embodiment.
Figure 2:
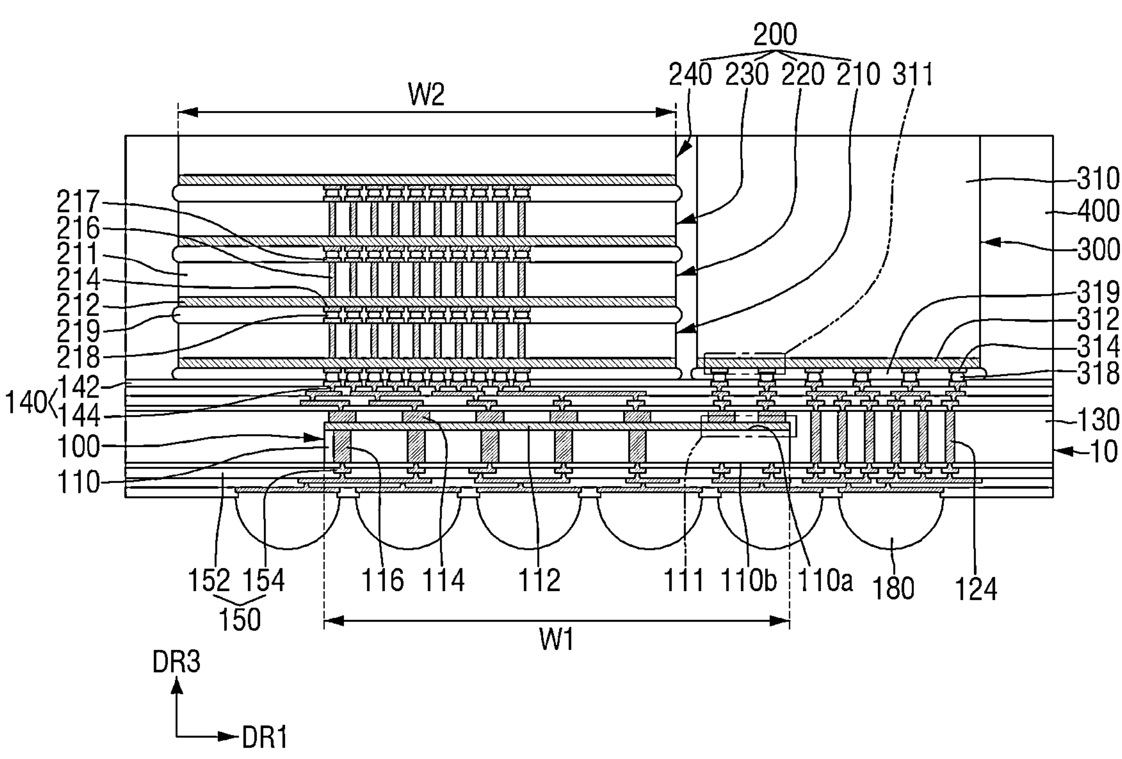
FIG. 2 is a cross-sectional view taken along line I-I of FIG. 1.

FIG. 1 is a plan view of a semiconductor package according to an example embodiment. FIG. 2 is a cross-sectional view taken along line I-I of FIG. 1.

Referring to FIGS. 1 and 2, a semiconductor package according to an example embodiment may include a buffer structure 10, a chip stack 200 including a plurality of first semiconductor chips 210, 220, 230, and 240, and a second semiconductor chip 300.

The chip stack 200 and the second semiconductor chip 300 may be disposed on the buffer structure 10. The chip stack 200 and the second semiconductor chip 300 may be spaced apart from each other. The chip stack 200 may be spaced apart from the second semiconductor chip 300 in, for example, a first direction DR1. The first direction DR1 and a second direction DR2 may intersect each other, and may be directions parallel to an upper surface of the buffer structure 10. A third direction DR3 may intersect the first direction DR1 and the second direction DR2, and may be a direction perpendicular to the upper surface of the buffer structure 10.

In the drawings, a width in the second direction DR2 of the chip stack 200 is similar to a width in the second direction DR2 of the second semiconductor chip 300, but this is merely an example. In some example embodiments, the width in the second direction DR2 of the chip stack 200 may be smaller than the width in the second direction DR2 of the second semiconductor chip 300. In the drawings, a width in the first direction DR1 of the chip stack 200 is greater than a width in the first direction DR1 of the second semiconductor chip 300, this is merely an example. In some example embodiments the width in the first direction DR1 of the chip stack 200 may be smaller than the width in the first direction DR1 of the second semiconductor chip 300.

The buffer structure 10 may include a buffer chip 100, a first redistribution layer 140, a second redistribution layer 150, a second redistribution layer 150, a first molding layer 130, and a first pillar 114, and a second pillar 124.

The buffer chip 100 may include a buffer substrate 110, a semiconductor element layer 112, and a through electrode 116. The buffer chip 100 may overlap a portion of the chip stack 200 and a portion of the second semiconductor chip 300 in the third direction DR3.

The buffer substrate 110 may include a first surface **110*a* and a second surface 110*b* that are opposed to each other in the third direction DR3. The first surface 110*a* may be an upper surface of the buffer substrate 110 and the second surface 110*b* may be a lower surface of the buffer substrate 110 with respect to the third direction DR3. The first surface 110*a* may be an active surface of the buffer chip 100 and the second surface 110*b* may be an inactive surface of the buffer chip 100**.

The buffer substrate 110 may include, for example, a semiconductor material, such as silicon (Si). In some example embodiments, the buffer substrate 110 may include a semiconductor element such as germanium (Ge), or a compound semiconductor such as silicon carbide (SiC), gallium arsenide (GaAs), indium arsenide (InAs), or indium phosphide (InP). The buffer substrate 110 may include a conductive region, for example, a well doped with impurities. The buffer substrate 110 may have various device isolation structure, such as a shallow trench isolation (STI) structure.

The semiconductor element layer 112 may be disposed on the first surface **110*a* of the buffer substrate 110. For example, the semiconductor element layer 112 may be in contact with the first surface 110*a* of the buffer substrate 110. The semiconductor element layer 112** may include various microelectronic devices, for example, a metal-oxide-semiconductor field effect transistor (MOSFET) such as a complementary metal-insulator-semiconductor transistor (CMOS), a system large scale integration (LSI), a flash memory, a DRAM, a SRAM, an EEPROM, a PRAM, an MRAM, RERAM, an image sensor (e.g., a CMOS imaging sensor (CIS)), a micro-electro-mechanical system (MEMS), an active device, a passive device, and the like.

The through electrode 116 may penetrate through the buffer substrate 110. The through electrode 116 may extend from the first surface **110*a* of the buffer substrate 110 to the second surface 110*b* of the buffer substrate 110. The through electrode 116 may be electrically connected to the first pillar 114 and the second redistribution layer 150**.

The through electrode 116 may include at least one of, for example, Cu, Cu alloy (e.g., CuSn, CuMg, CuNi, CuZn, CuPd, CuAu, CuRe, or CuW), W, W alloy, Ni, Ru, or Co. However, the present disclosure is not limited thereto.

The first redistribution layer 140 may be disposed on the buffer chip 100. The first redistribution layer 140 may be disposed on the first surface **110*a* of the buffer substrate 110. The first redistribution layer 140 may face the active surface of the buffer chip 100. The first redistribution layer 140 may include a first interlayer insulating film 142 and a first wiring pattern 144**.

The first interlayer insulating film 142 may include a plurality of interlayer insulating films stacked on the third direction DR3. The first interlayer insulating film 142 may include at least one of, for example, silicon oxide, silicon nitride, or silicon oxynitride, but is not limited thereto.

The first wiring pattern 144 may be disposed within the first interlayer insulating film 142. The first interlayer insulating film 142 may surround the first wiring pattern 144. The first wiring pattern 144 may be disposed within each of the interlayer insulating films stacked in the third direction DR3. The first wiring pattern 144 disposed within one interlayer insulating film may include a plurality of wirings spaced apart from one another in the first direction DR1 and the second direction DR2. That is, the first wiring pattern 144 may include a plurality of wirings spaced apart from one another in each of the first direction DR1, the second direction DR2, and the third direction DR3.

The first wiring pattern 144 may include at least one of, for example, tungsten (W), aluminum (Al), or copper (Cu), but is not limited thereto.

The second redistribution layer 150 may be disposed on the buffer chip 100. The second redistribution layer 150 may be disposed on the second surface 110*b* of the buffer substrate 110. The second redistribution layer 150 may be electrically connected to the through electrode 116. The second redistribution layer 150 may include a second interlayer insulating film 152 and a second wiring pattern 154.

The second interlayer insulating film 152 may include a plurality of interlayer insulating films stacked on the third direction DR3. The second interlayer insulating film 152 may include at least one of, for example, silicon oxide, silicon nitride, or silicon oxynitride, but is not limited thereto.

The second wiring pattern 154 may be disposed within the second interlayer insulating film 152. The second interlayer insulating film 152 may surround the second wiring pattern 154. The second wiring pattern 154 may be disposed within each of the interlayer insulating films stacked in the third direction DR3. The second wiring pattern 154 disposed within one interlayer insulating film may include a plurality of wirings spaced apart from one another in the first direction DR1 and the second direction DR2. That is, the second wiring pattern 154 may include a plurality of wirings spaced apart from one another in each of the first direction DR1, the second direction DR2, and the third direction DR3.

The second wiring pattern 154 may include at least one of, for example, tungsten (W), aluminum (Al), or copper (Cu), but is not limited thereto.

The first molding layer 130 may fill a space between the first redistribution layer 140 and the second redistribution layer 150. The first molding layer 130 may surround the buffer chip 100. The first molding layer 130 may cover the buffer chip 100. The first molding layer 130 may expose a lower surface of the buffer chip 100 (e.g., the second surface 110*b* of the buffer substrate 110). The first molding layer 130 may include, for example, an epoxy molding compound (EMC) or two or more types of silicone hybrid materials, but is not limited thereto.

The first pillar 114 may be disposed on the buffer chip 100. The first pillar 114 may be disposed on the semiconductor element layer 112. The first pillar 114 may be disposed between the buffer chip 100 and the first redistribution layer 140. The first pillar 114 may penetrate through the first molding layer 130 and be electrically connected to the buffer chip 100 and the first redistribution layer 140.

The second pillar 124 may be disposed between the first redistribution layer 140 and the second redistribution layer 150. The second pillar 124 may penetrate through the first molding layer 130 and be electrically connected to the first redistribution layer 140 and the second redistribution layer 150. The second semiconductor chip 300 may be electrically connected to a connection terminal 180 through the second pillar 124. For example, the second pillar 124 may overlap at least a portion of the second semiconductor chip 300 in the third direction DR3. That is, the second pillar 124 may be disposed, for example, below the second semiconductor chip 300. The second pillar 124 may be disposed, for example, on one side of the buffer chip 100.

The first and second pillars 114 and 124 may include the same material. Each of the first and second pillars 114 and 124 may include, for example, copper (Cu). The first and second pillars 114 and 124 may be in contact with the first redistribution layer 140. The first and second pillars 114 and 124 may be in contact with the first wiring pattern 144. The first and second pillars 114 and 124 may be bonded to the first wiring pattern 144. The first redistribution layer 140, the buffer chip 100, and the second redistribution layer 150 may be bonded to one another by Cu—Cu hybrid bonding.

The connection terminal 180 may be disposed on the buffer structure 10. The connection terminal 180 may be disposed on the second redistribution layer 150. The connection terminal 180 may be electrically connected to the second redistribution layer 150. The connection terminal 180 may include, for example, a solder bump or a solder ball. The connection terminal 180 may include at least one of, for example, gold (Au), silver (Ag), platinum (Pt), aluminum (Al), or copper (Cu).

The chip stack 200 may be disposed on the buffer structure 10. The chip stack 200 may be disposed on the first redistribution layer 140. At least a portion of the chip stack 200 may overlap the buffer chip 100 in the third direction DR3.

The chip stack 200 may include a plurality of first semiconductor chips 210, 220, 230, and 240 stacked in the third direction DR3. A plurality of first semiconductor chips 210, 220, 230, and 240 may be sequentially stacked in the third direction DR3. Although the chip stack 200 includes four first semiconductor chips 210, 220, 230, and 240 in the drawing, this is merely an example, and the number of first semiconductor chips included in the chip stack 200 may vary. For example, the chip stack 200 may include eight, twelve, or sixteen first semiconductor chips.

The first semiconductor chips 210, 220, and 230 may each include a first semiconductor substrate 211, a first semiconductor element layer 212, a first lower chip pad 214, a first through electrode 216, and a first upper chip pad 217. The first semiconductor element layer 212 may be disposed on a lower surface of the first semiconductor substrate 211. The first lower chip pad 214 may be disposed on the first semiconductor element layer 212. The first upper chip pad 217 may be disposed on an upper surface of the first semiconductor substrate 211. The lower surface and the upper surface of the first semiconductor substrate 211 may be based on the third direction DR3. The first through electrode 216 may penetrate through the first semiconductor substrate 211. The first through electrode 216 may be electrically connected to the first lower chip pad 214 and the first upper chip pad 217.

The first semiconductor chip 240 disposed at the top of the chip stack 200 may include a first semiconductor substrate 211, a first semiconductor element layer 212, and a first lower chip pad 214. The first semiconductor chip 240 may omit the first through electrode 216 disposed therein.

Because the chip stack 200 is disposed on the buffer structure 10, the size of the buffer chip 100 does not need to be larger than the size of the first semiconductor chips 210, 220, 230, and 240. The size of the buffer chip 100 is not limited by the size of the first semiconductor chip 210, 220, 230, or 240.

In some example embodiments, the width of each of the first semiconductor chips 210, 220, 230, and 240 may be different from the width of the buffer chip 100. For example, a first width W1 in the first direction DR1 of the buffer chip 100 may be smaller than a second width W2 in the first direction DR1 of each of the first semiconductor chips 210, 220, and 230. In other words, a first width W1 in the first direction DR1 of the buffer chip 100 may be smaller than a second width W2 in the first direction DR1 of the chip stack 200.

A first chip connection terminal 218 may be disposed between each pair of adjacent first semiconductor chips 210, 220, 230, and 240. The first chip connection terminal 218 may be disposed between the first lower chip pad 214 and the first upper chip pad 217. For example, the first chip connection terminal 218 may be disposed between the first lower chip pad 214 of the first semiconductor chip 220 and the first upper chip pad 217 of the first semiconductor chip 210. The first chip connection terminal 218 may be electrically connected to the first lower chip pad 214 and the first upper chip pad 217. The first semiconductor chips 210, 22, 230, and 240 may be electrically connected to one another through the first chip connection terminal 218.

The first chip connection terminal 218 may be disposed between the chip stack 200 and the buffer structure 10. The first chip connection terminal 218 may be disposed between the first lower chip pad 214 of the first semiconductor chip 210 and the first wiring pattern 144 of the first redistribution layer 140. The first chip connection terminal 218 may be electrically connected to the first lower chip pad 214 of the first semiconductor chip 210 and the first wiring pattern 144 of the first redistribution layer 140. The chip stack 200 may be electrically connected to the buffer structure 10 through the first chip connection terminal 218.

A first underfill material layer 219 may be disposed between the first semiconductor chips 210, 220, 230, and 240, and between the first semiconductor chip 210 and the buffer structure 10. The first underfill material layer 219 may fill spaces between the first semiconductor chips 210, 220, 230, and 240 and a space between the first semiconductor chip 210 and the buffer structure 10. The first underfill material layer 219 may surround the first chip connection terminal 218.

The second semiconductor chip 300 may be disposed on the buffer structure 10. The second semiconductor chip 300 may be disposed on the first redistribution layer 140. The second semiconductor chip 300 may be spaced apart from the chip stack 200.

An upper surface of the second semiconductor chip 300 may be coplanar with, for example, the upper surface of the chip stack 200. The height from the buffer structure 10 to the upper surface of the second semiconductor chip 300 may be the same as or substantially similar to the height from the buffer structure 10 to the upper surface of the chip stack 200.

The second semiconductor chip 300 may include a second semiconductor substrate 310, a second semiconductor element layer 312, and a second lower chip pad 314. The second semiconductor element layer 312 may be disposed on a lower surface of the second semiconductor substrate 310. The lower surface of the second semiconductor substrate 310 may face the buffer structure 10.

A second chip connection terminal 318 may be disposed between the second semiconductor chip 300 and the buffer structure 10. The second chip connection terminal 318 may be disposed between the second lower chip pad 314 of the second semiconductor chip 300 and the first wiring pattern 144 of the first redistribution layer 140. The second chip connection terminal 318 may be electrically connected to the second lower chip pad 314 of the second semiconductor chip 300 and the first wiring pattern 144 of the first redistribution layer 140. The second semiconductor chip 300 may be electrically connected to the buffer structure 10 through the second chip connection terminal 318.

For example, a maximum width of each of the first and second chip connection terminals 218 and 318 may be different from a maximum width of the connection terminal 180. The maximum width of each of the first and second chip connection terminals 218 and 318 may be smaller than the maximum width of the connection terminal 180.

A second underfill material layer 319 may be disposed between the second semiconductor chip 300 and the buffer structure 10. The second underfill material layer 319 may fill a space between the second semiconductor chip 300 and the buffer structure 10. The second underfill material layer 319 may surround the second chip connection terminal 318.

Each of the first and second chip connection terminals 218 and 318 may include, for example, a solder bump or a solder ball. The first and second chip connection terminals 218 and 318 may each include at least one of, for example, gold (Au), silver (Ag), platinum (Pt), aluminum (Al), or copper (Cu).

The first and second underfill materials 219 and 319 may each include, for example, an insulating polymer material such as an EMC, but the present disclosure is not limited thereto.

The second molding layer 400 may be disposed on the buffer structure 10. The second molding layer 400 may be disposed on the first surface 110*a* of the buffer substrate 110. The second molding layer 400 may cover the buffer structure 10. The second molding layer 400 may cover at least a portion of the chip stack 200 and at least a portion of the second semiconductor chip 300. The second molding layer 400 may surround the chip stack 200 and the second semiconductor chip 300. The second molding layer 400 may include, for example, an EMC.

In some example embodiments, the second molding layer 400 may expose at least a portion of the chip stack 200 and at least a portion of the second semiconductor chip 300. In the third direction DR3, the second molding layer 400 may expose the upper surface of the chip stack 200 and the upper surface of the second semiconductor chip 300. An upper surface of the second molding layer 400 may be coplanar with the upper surface of the chip stack 200 and the upper surface of the second semiconductor chip 300.

The first semiconductor chips 210, 220, 230, and 240 may each be a memory semiconductor chip. The memory semiconductor chip may be a volatile memory, such as a dynamic random access memory (DRAM) or a static random access memory (SRAM), or a non-volatile memory, such as a phase-change random access memory (PRAM), a magnetoresistive random access memory (MRAM), a ferroelectric random access memory (FeRAM), or a resistive random access memory (RRAM). The chip stack 200 may be, for example, a high bandwidth memory (HBM).

The first semiconductor element layer 212 of each of the first semiconductor chips 210, 220, 230, and 240 may include a memory cell array. The first semiconductor element layer 212 may include a memory transistor constituting a memory circuit and a wiring layer on the memory transistor.

The semiconductor element layer 112 of the buffer chip 100 may not include a memory cell array. The semiconductor element layer 112 may include a first physical region 111. The first physical region 111 may include an interface circuit (e.g., PHY). The chip stack 200 may receive signals from the second semiconductor chip 300 or transmit signals to the second semiconductor chip 300 through the first physical region 111 of the buffer chip 100. The signals and/or data received through the first physical region 111 of the buffer chip 100 may be transferred to the chip stack 200. The signals and/or data received through the first physical region 111 of the buffer chip 100 may be transferred to the first semiconductor chips 210, 200, and 230 through the first through electrode 216.

The semiconductor element layer 112 may further include a test logic circuit such as a design for test (DFT), a joint test action group (JTAG), a memory built-in self-test (MBIST), or a serial-parallel conversion circuit.

The second semiconductor chip 300 may be a logic semiconductor chip. The logic semiconductor chip may be an application processor (AP) (e.g., a central processing unit (CPU), a graphic processing unit (GPU), a field-programmable gate array (FPGA), a digital signal processor, an encryption processor, a micro-processor, a micro-controller, or an application-specific IC (ASIC)), but is not limited thereto.

The second semiconductor element layer 312 of the second semiconductor chip 300 may include a second physical region 311. The second physical region 311 may include input/output circuits from transmitting and receiving signals to and from the first physical region 111 of the buffer chip 100. The second semiconductor chip 300 may provide various signals to the first physical region 111 through the second physical region 311. That is, the buffer chip 100 and the second semiconductor chip 300 may transmit and receive signals therebetween through the first physical region 111 and the second physical region 311.

The second semiconductor chip 300 may be disposed on the buffer chip 100 such that a distance between the second physical region 311 and the first physical region 111 is minimized. In the third direction DR3, the second semiconductor chip 300 may overlap at least a portion of the buffer chip 100. In the third direction DR3, the second physical region 311 of the second semiconductor chip 300 may overlap at least a portion of the first physical region 111 of the buffer chip 100. The second physical region 311 of the second semiconductor chip 300 may be disposed toward the buffer chip 100. The second physical region 311 may face the first redistribution layer 140, and the first physical region 111 may face the first redistribution layer 140. Accordingly, the distance between the second physical region 311 of the second semiconductor chip 300 and the first physical region 111 of the buffer chip 100 may be further reduced. Therefore, a semiconductor package with improved data processing speed may be realized. In addition, the second semiconductor chip 300 and the buffer chip 100 may be connected to each other without separate interposer.

Figure 3:
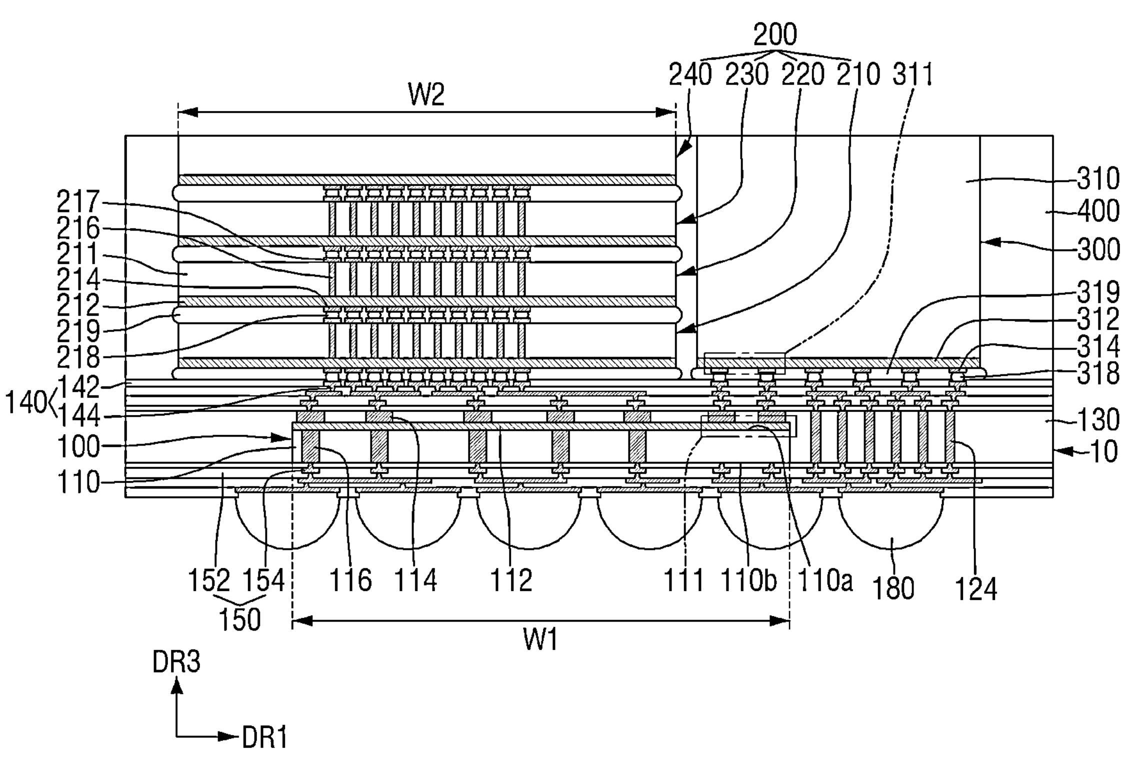
Figure 4:
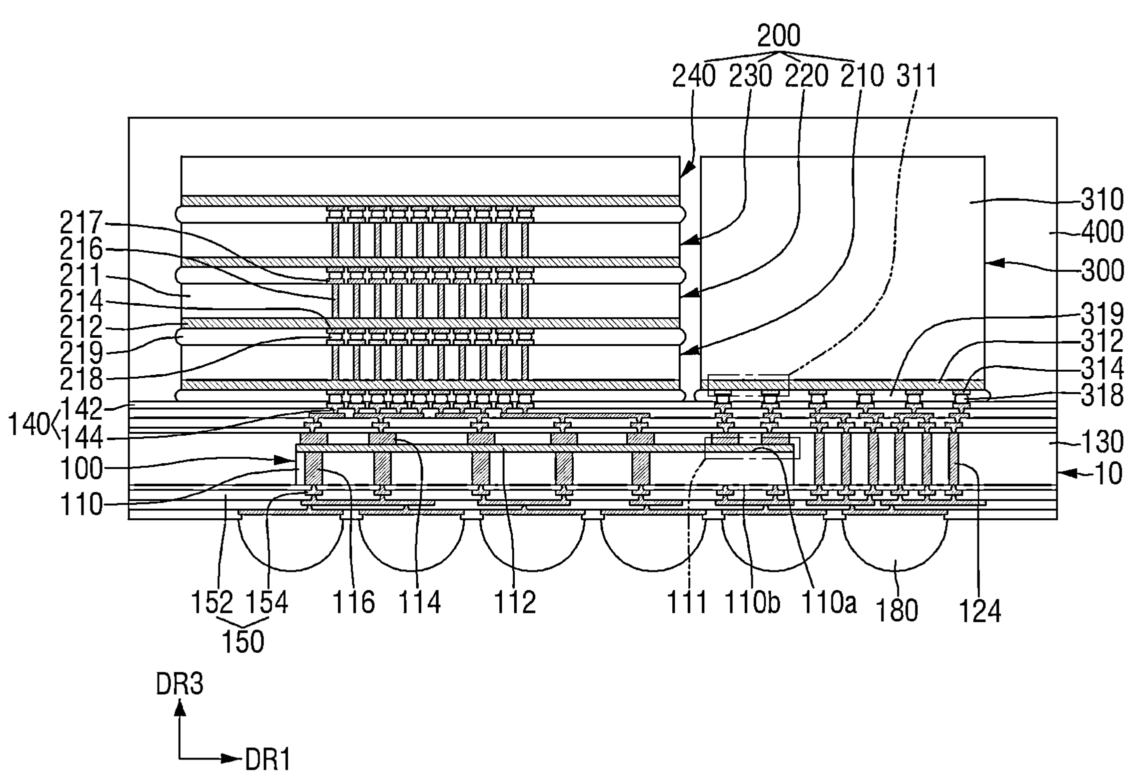
Figure 5:
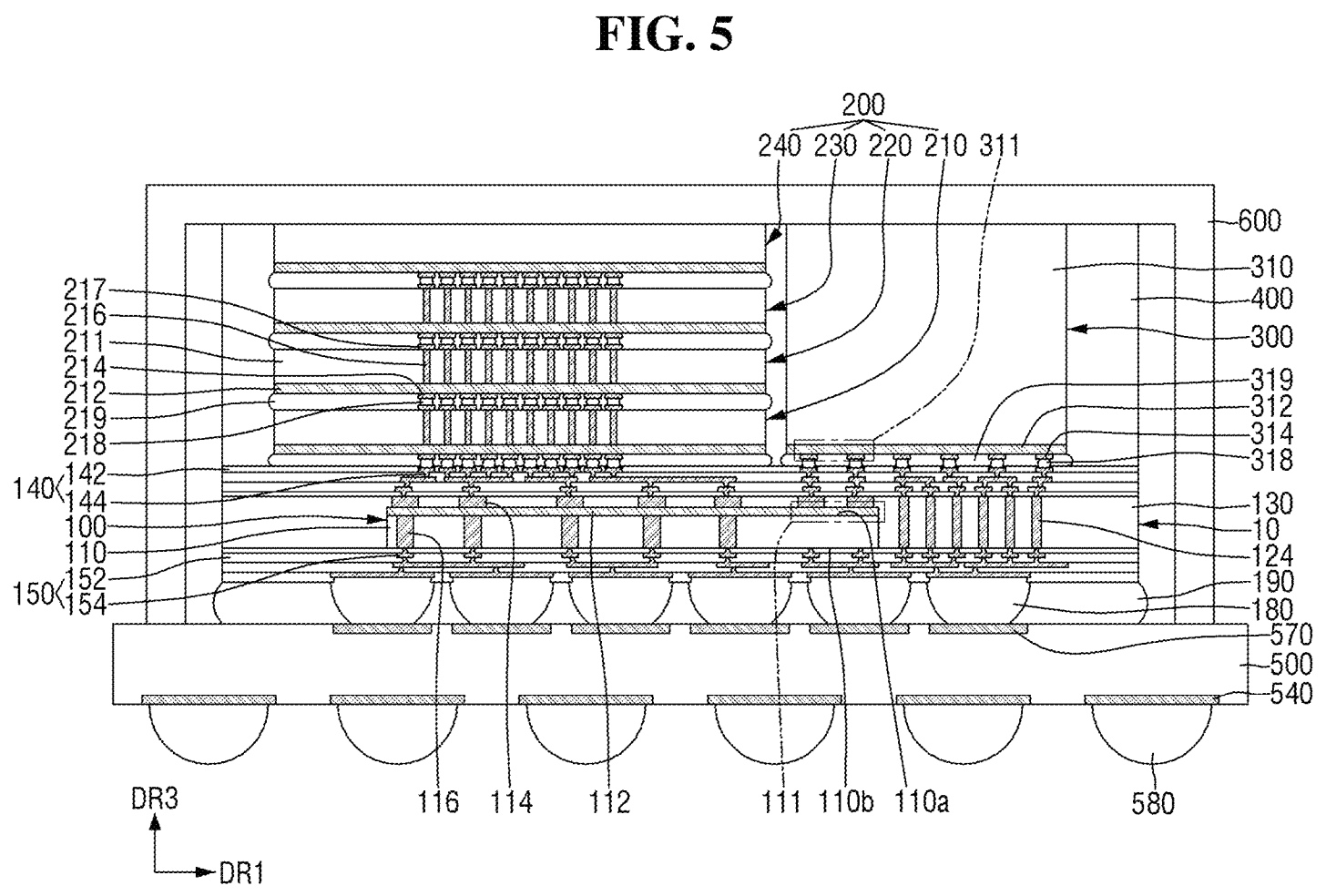

FIGS. 3 to 5 are views of a semiconductor package according to some example embodiments. For reference, FIGS. 3 to 5 are cross-sectional views taken along line I-I of FIG. 1. For convenience of description, the following description will focus on differences from those described with reference to FIGS. 1 and 2.

Referring to FIG. 3, in the semiconductor package according to an example embodiment, the width of each of the first semiconductor chips 210, 220, 230, and 240 may be the same as or substantially similar to the width of the buffer chip 100. For example, in the first direction DR1, a first width W1 of the buffer chip 100 may be identical or substantially similar to a second width W2 of each of the first semiconductor chips 210, 220, and 230.

Referring to FIG. 4, in the semiconductor package according to an example embodiment, the second molding layer 400 may cover the chip stack 200 and the second semiconductor chip 300. In the third direction DR3, the second molding layer 400 may cover the upper surface of the chip stack 200 and the upper surface of the second semiconductor chip 300. The upper surface of the second molding layer 400 may be located above the upper surface of the chip stack 200 and the upper surface of the second semiconductor chip 300.

Referring to FIG. 5, the semiconductor package according to an example embodiment may further include a package substrate 500 and a heat dissipation member 600.

The package substrate 500 may be, for example, a printed circuit board (PCB). The package substrate 500 may include a first substrate pad 540 and a second substrate pad 570. The first substrate pad 540 may be disposed on a lower surface of the package substrate 500 and the second substrate pad 570 may be disposed on an upper surface of the package substrate 500. The upper surface and the lower surface of the package substrate 500 may be based on the third direction DR3.

A package connection terminal 580 may be disposed on the package substrate 500. The package connection terminal 580 may be disposed on the first substrate pad 540. The package connection terminal 580 may be electrically connected to the first substrate pad 540.

The package connection terminal 580 may be, for example, a solder bump, but is not limited thereto. The package connection terminal 580 may have various shapes, such as a land, a ball, a pin, or a pillar.

For example, a maximum width of the package connection terminal 580 may be different from the maximum width of each of the first and second chip connection terminals 218 and 318 and the maximum width of the connection terminal 180. The maximum width of the package connection terminal 580 may be greater than the maximum width of each of the first and second chip connection terminals 218 and 318 and the maximum width of the connection terminal 180.

The buffer structure 10 may be mounted on the package substrate 500. The connection terminal 180 may be disposed between the buffer structure 10 and the package substrate 500. The connection terminal 180 may be disposed between the second redistribution layer 150 and the package substrate 500. The connection terminal 180 may be electrically connected to the second wiring pattern 154 and the second substrate pad 570.

An underfill material layer 190 may be disposed between the package substrate 500 and the buffer structure 10. The underfill material layer 190 may fill a space between the package substrate 500 and the buffer structure 10. The underfill material layer 190 may surround the connection terminal 180. The underfill material layer 190 may include, for example, an insulating polymer material such as an EMC, but is not limited thereto.

The heat dissipation member 600 may be disposed on the package substrate 500. The heat dissipation member 600 may extend from one side of the package substrate 500 to the other side. The heat dissipation member 600 may cover the chip stack 200 and the second semiconductor chip 300. The heat dissipation member 600 may enclose the buffer structure 10, the chip stack 200, and the second semiconductor chip 300.

The heat dissipation member 600 may include a heat dissipation plate such as a heat slug or a heat sink. In some example embodiments, a heat conductive material layer may be further disposed between the heat dissipation member 600 and the chip stack 200 and the second semiconductor chip 300.

Figure 6:
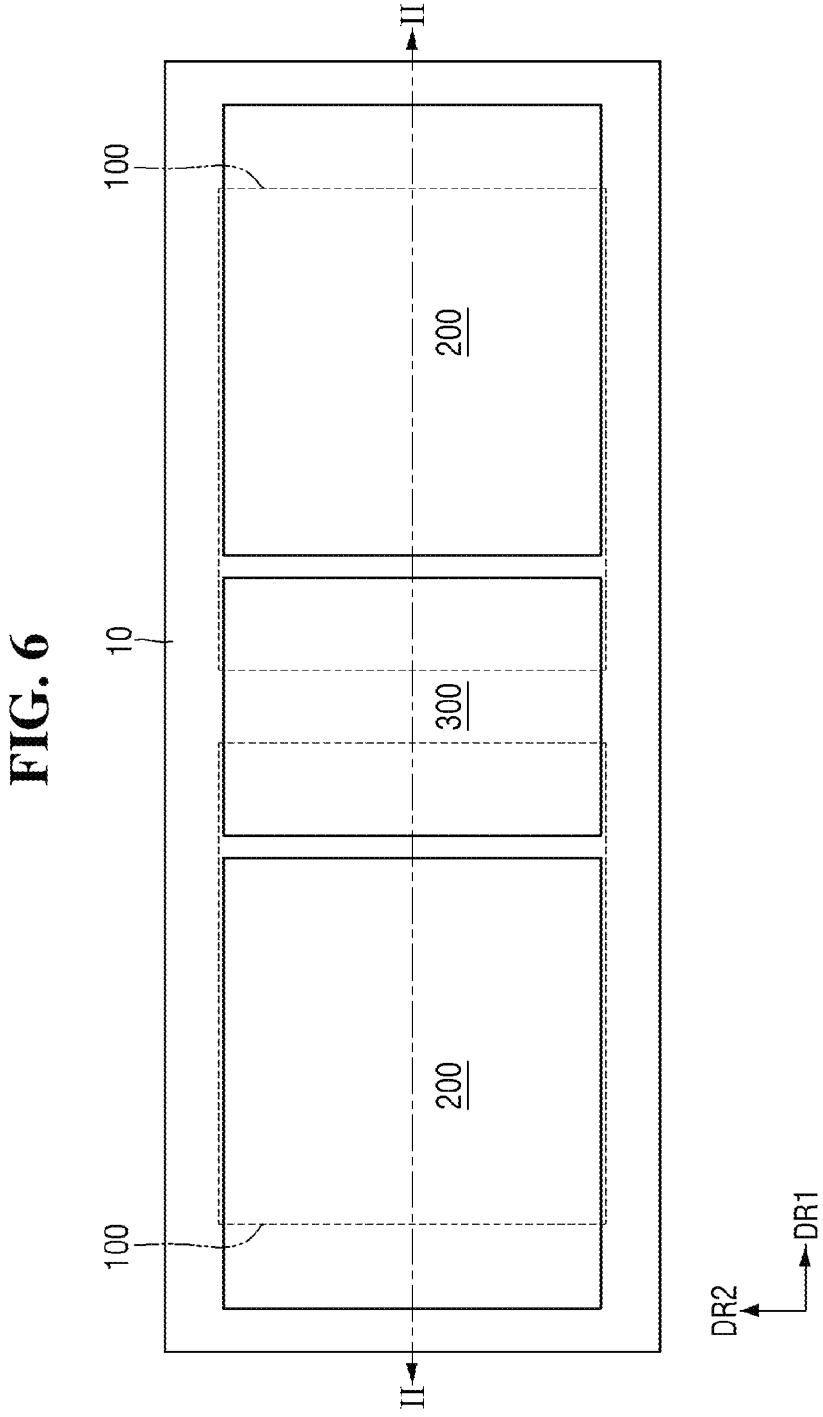
FIG. 6 is a plan view of a semiconductor package according to an example embodiment.
Figure 7:
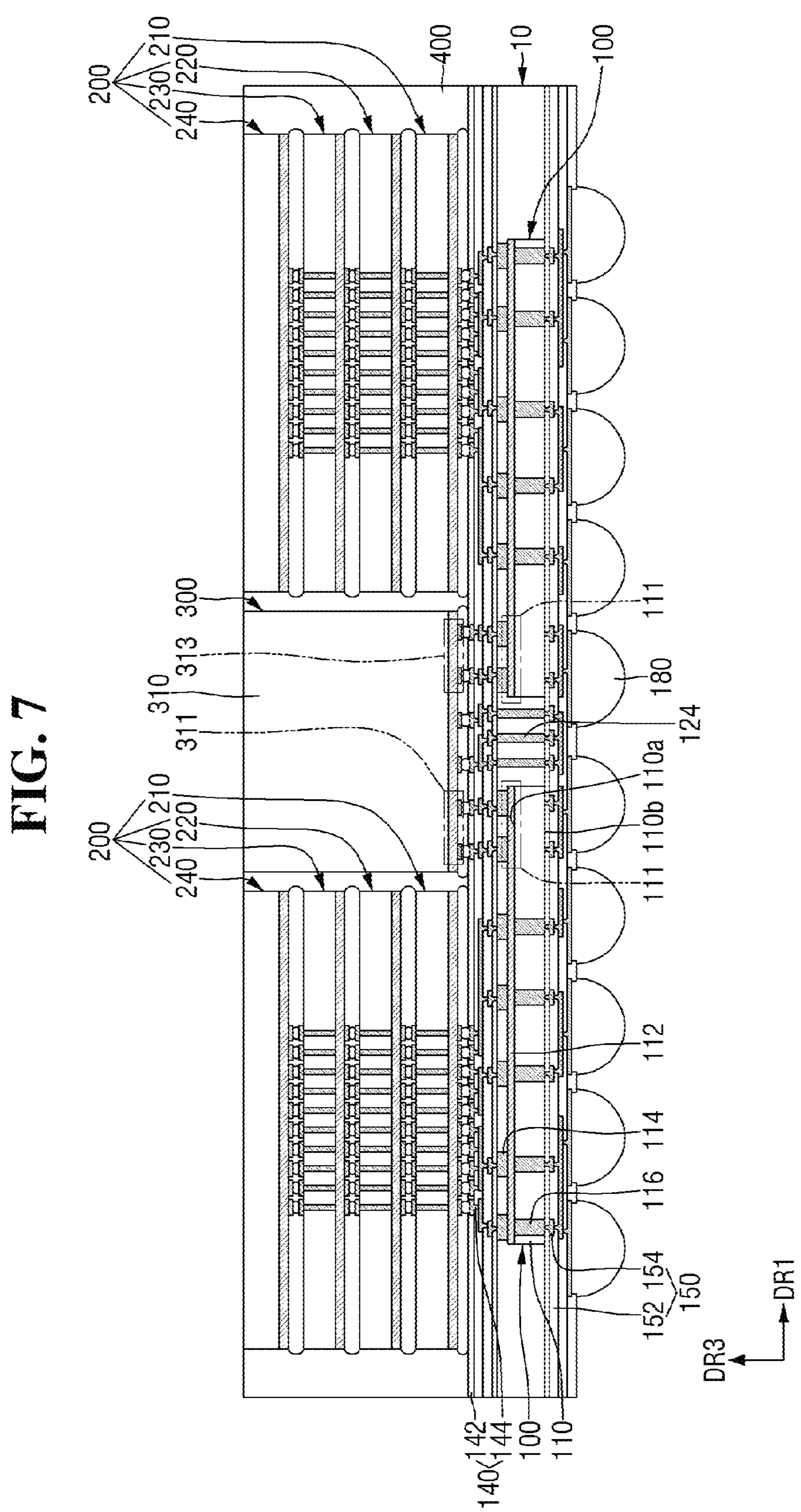
FIG. 7 is a cross-sectional view taken along line II-II of FIG. 6.

FIG. 6 is a plan view of a semiconductor package according to an example embodiment. FIG. 7 is a cross-sectional view taken along line II-II of FIG. 6. For convenience of description, the following description will focus on differences from those described with reference to FIGS. 1 to 6.

Referring to FIGS. 6 and 7, a semiconductor package according to an example embodiment may include two chip stacks 200 and one second semiconductor chip 300. One second semiconductor chip 300 and a plurality of chip stacks 200 may be mounted on a buffer structure 10.

The chip stacks 200 may be spaced apart from the second semiconductor chip 300. The chip stacks 200 may be disposed at each side of the second semiconductor chip 300. The second semiconductor chip 300 may be disposed between the chip stacks 200. For example, the chip stacks 200 may be disposed on each side of the second semiconductor chip 300 in the first direction DR1.

The buffer structure 10 may include two buffer chips 100. Each chip stack 200 may be disposed on a corresponding ones of the two buffer chips 100. In the third direction DR3, each of the chip stacks 200 may be disposed to overlap at least a portion of a corresponding one of the two buffer chips 100. That is, the ratio of the chip stacks 200 and the buffer chips 100 may be 1:1.

A second semiconductor element layer 312 of the second semiconductor chip 300 may include second physical regions 311 and 313. In the third direction DR3, each of the second physical regions 311 and 313 of the second semiconductor chip 300 may overlap at least a portion of a first physical region 111 of a corresponding one of the two buffer chips 100.

Each chip stack 200 may transmit and receive signals to and from the second semiconductor chip 300 through a corresponding one of the two buffer chips 100 that at least partially overlaps the chip stack 200 in the third direction DR3. The chip stack 200 disposed on one side of the second semiconductor chip 300 may receive signals from the second physical region 311 of the second semiconductor chip 300 or transmit signals to the second physical region 311 of the second semiconductor chip 300 through the first physical region 111 of the buffer chip 100 that overlaps the second physical region 311 of the second semiconductor chip 300. The chip stack 200 disposed on the other side of the second semiconductor chip 300 may receive signals from the second physical region 313 of the second semiconductor chip 300 or transmit signals to the second physical region 313 of the second semiconductor chip 300 through the first physical region 111 of the buffer chip 100 that overlaps the second physical region 313 of the second semiconductor chip 300.

Figure 8:
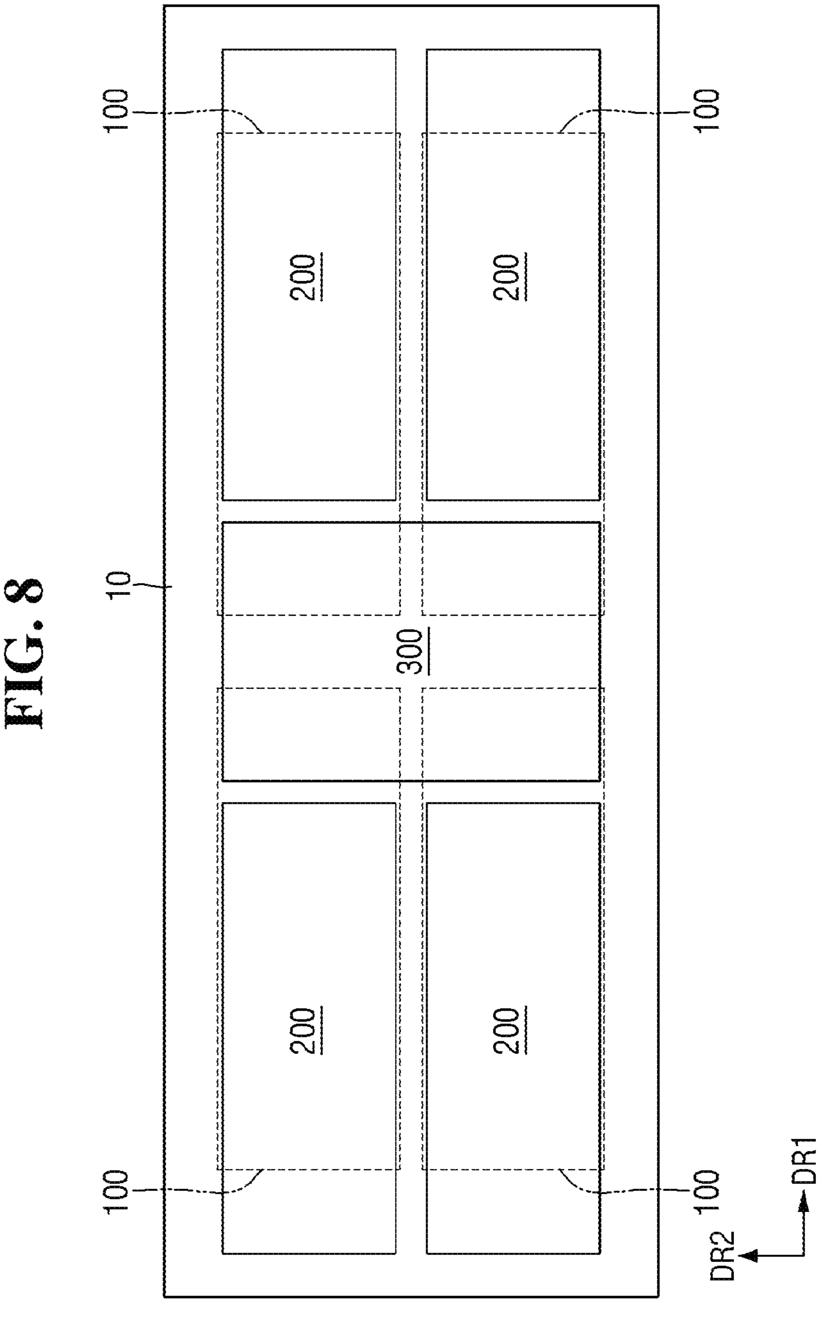
FIGS. 8 and 9 are plan views of a semiconductor package according to some example embodiments.
Figure 9:
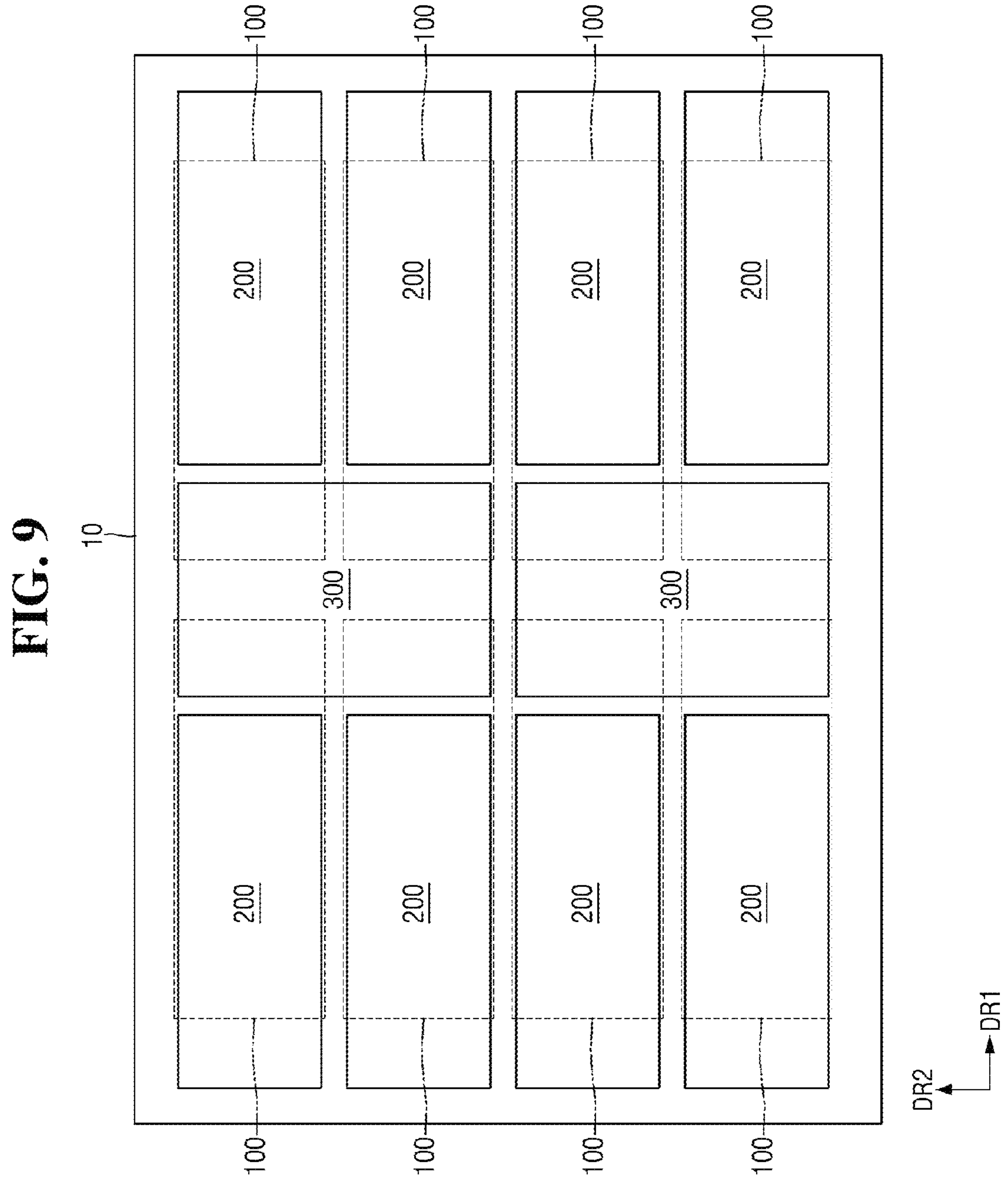

FIGS. 8 and 9 are plan views of a semiconductor package according to some example embodiments. For convenience of description, the following description will focus on differences from those described with reference to FIGS. 1 to 7.

Referring to FIG. 8, a semiconductor package according to an example embodiment may include four chip stacks 200 and one second semiconductor chip 300. The four chip stacks 200 and one second semiconductor chip 300 may be disposed on a buffer structure 10.

The second semiconductor chip 300 may be disposed between the chip stacks 200. The chip stacks 200 may be disposed around the second semiconductor chip 300. For example, two chip stacks 200 may be disposed on one side of the second semiconductor chip 300 and the other two chip stacks 200 may be disposed on the other side of the second semiconductor chip 300.

The buffer structure 10 may include four buffer chips 100. Each chip stack 200 may be disposed on a corresponding one of the buffer chips 100. In the third direction DR3, each of the chip stacks 200 may be disposed to overlap at least a portion of a corresponding one of the buffer chips 100.

Each chip stack 200 may transmit and receive signals to and from the second semiconductor chip 300 through a corresponding one of the buffer chips 100 that at least partially overlaps the chip stack 200 in the third direction DR3. The first physical region of each buffer chip 100 may overlap at least a portion of the second physical region of the second semiconductor chip 300. Each buffer chip 100 may receive signals from the second physical region of the second semiconductor chip 300 or transmit signals to the second physical region of the second semiconductor chip 300 through the first physical region of a corresponding one of the buffer chips 100 that overlaps at least a portion of the second physical region of the second semiconductor chip 300.

Referring to FIG. 9, a semiconductor package according to an example embodiment may include eighth chip stacks 200 and two second semiconductor chips 300. The eighth chip stacks 200 and the two second semiconductor chips 300 may be mounted on a buffer structure 10.

The second semiconductor chips 300 may be spaced apart from each other in the second direction DR2. The second semiconductor chip 300 may be disposed between the chip stacks 200.

The buffer structure 10 may include eighth buffer chips 100. Each chip stack 200 may be disposed on each buffer chip 100. In the third direction DR3, each of the chip stacks 200 may be disposed to overlap at least a portion of a corresponding one of the buffer chips 100. A first physical region of each buffer chip 100 may overlap at least a portion of a second physical region of the second semiconductor chip in the third direction DR3 and may receive and transmit signals through the second physical region of the second semiconductor chip 300 that at least partially overlaps the first physical region. Each chip stack 200 may transmit and receive signals to and from the second semiconductor chip 300 through the first physical region of a corresponding one of the buffer chips 100 that at least partially overlaps the chip stack 200.

FIGS. 10 to 15 are views illustrating intermediate stages of manufacture, provided to explain a method of manufacturing a semiconductor package according to an example embodiment of the present disclosure. For convenience of description, the following description will focus on differences from those described with reference to FIGS. 1 to 9.

Figure 10:
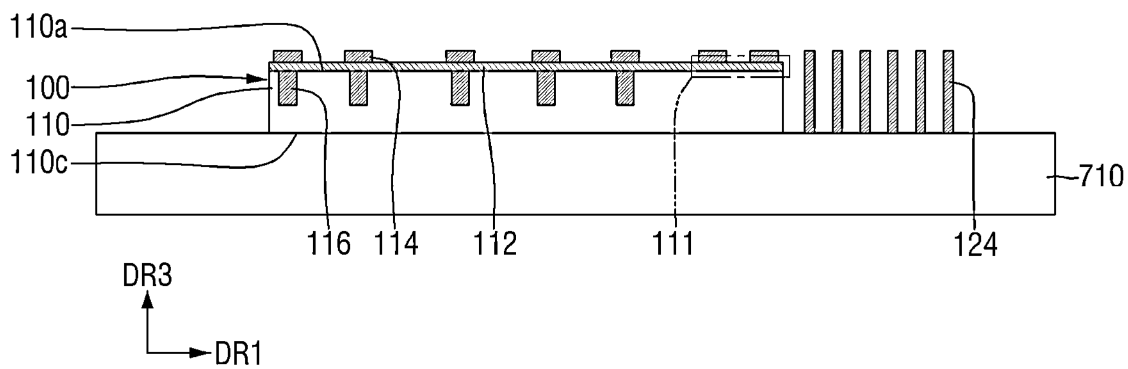
FIGS. 10 to 15 are views illustrating intermediate stages of manufacture, provided to explain a method of manufacturing a semiconductor package according to an example embodiment of the present disclosure.

Referring to FIG. 10, a buffer chip 100 and first and second pillars 114 and 124 may be formed on a first carrier substrate 710.

The buffer chip 100 may include a buffer substrate 110, a semiconductor element layer 112, and a through electrode 116. The buffer substrate 110 may include a first surface **110*a* and a third surface 110*c* that are opposed to each other. A semiconductor element layer 112 may be formed on the first surface 110*a* of the buffer substrate 110. A through electrode 116 may be disposed within the buffer substrate 110. The through electrode 116 may penetrate through at least a portion of the buffer substrate 110 from the first surface 110***a* of the buffer chip 110.

The buffer chip 100 may be disposed on the first carrier substrate 710 such that a surface of the buffer chip 100 on which the semiconductor element layer 112 is not disposed faces toward the first carrier substrate 710.

The first pillar 114 may be formed on the buffer chip 100. The first pillar 114 may be formed on the semiconductor element layer 112.

The second pillar 124 may be formed on the first carrier substrate 710. The second pillar 134 may be formed on, for example, one side of the buffer chip 100. In the third direction DR3, an upper surface of the second pillar 124 may be coplanar with an upper surface of the first pillar 114, but is not limited thereto.

The first carrier substrate 710 may include, for example, silicon, metal, glass, plastic, or ceramic.

The order in which the buffer chip 100 is formed on the first carrier substrate 710 and the first and second pillars 114 and 124 are formed on the first carrier substrate 710 may vary. That is, after the buffer chip 100 is formed on the first carrier substrate 710, the second pillar 124 may be formed on the first carrier substrate 710. In some example embodiments, after the second pillar 124 is formed on the first carrier substrate 710, the buffer chip 100 may be formed on the first carrier substrate 710. In addition, the first pillar 114 and the second pillar 124 may be formed simultaneously or sequentially.

Figure 11:
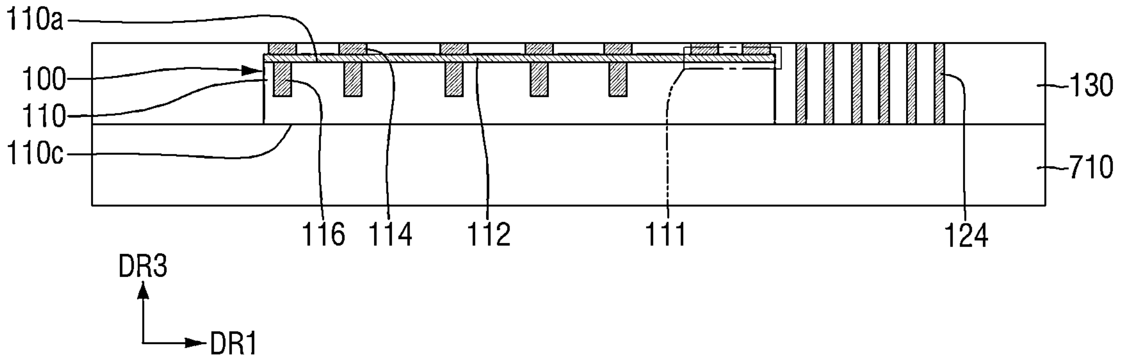

Referring to FIG. 11, a first molding layer 130 may be formed on the first carrier substrate 710. The first molding layer 130 may cover the buffer chip 100 and the first and second pillars 114 and 124. The first molding layer 130 may expose the upper surfaces of the first and second pillars 114 and 124 in the third direction DR3. That is, in the third direction DR3, an upper surface of the first molding layer 130 may be coplanar with the upper surfaces of the first and second pillars 114 and 124.

Figure 12:
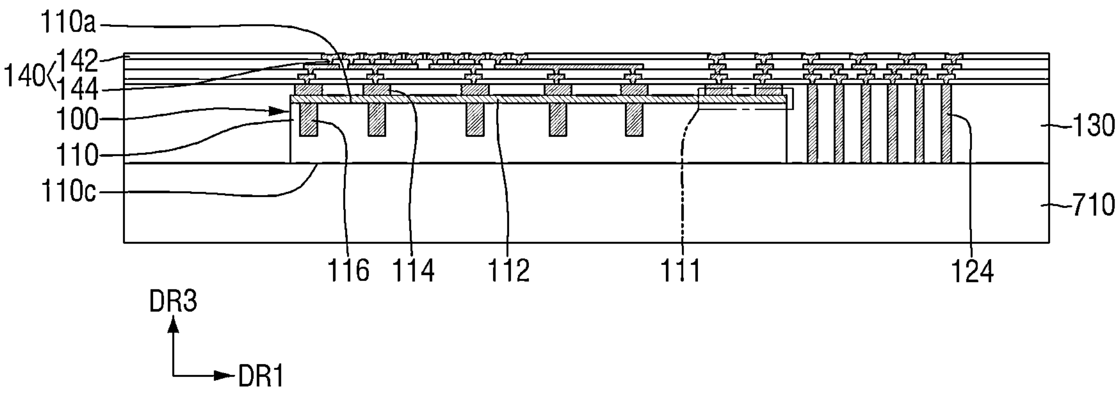

Referring to FIG. 12, a first redistribution layer 140 may be formed on the first molding layer 130. The first redistribution layer 140 may face the semiconductor element layer 112. The first redistribution layer 140 may include a plurality of first interlayer insulating films 142 and a plurality of first wiring patterns 144. The first redistribution layer 140 may be formed by repeatedly performing a process of forming and patterning the first interlayer insulating film 142 on the first molding layer 130 and a process of forming the first wiring pattern 144 within the patterned first interlayer insulating film 142. Accordingly, the first wiring pattern 144 may include a first wiring and a first via connected to the first wiring, and a width of the first via may decrease toward the buffer chip 100.

Figure 13:
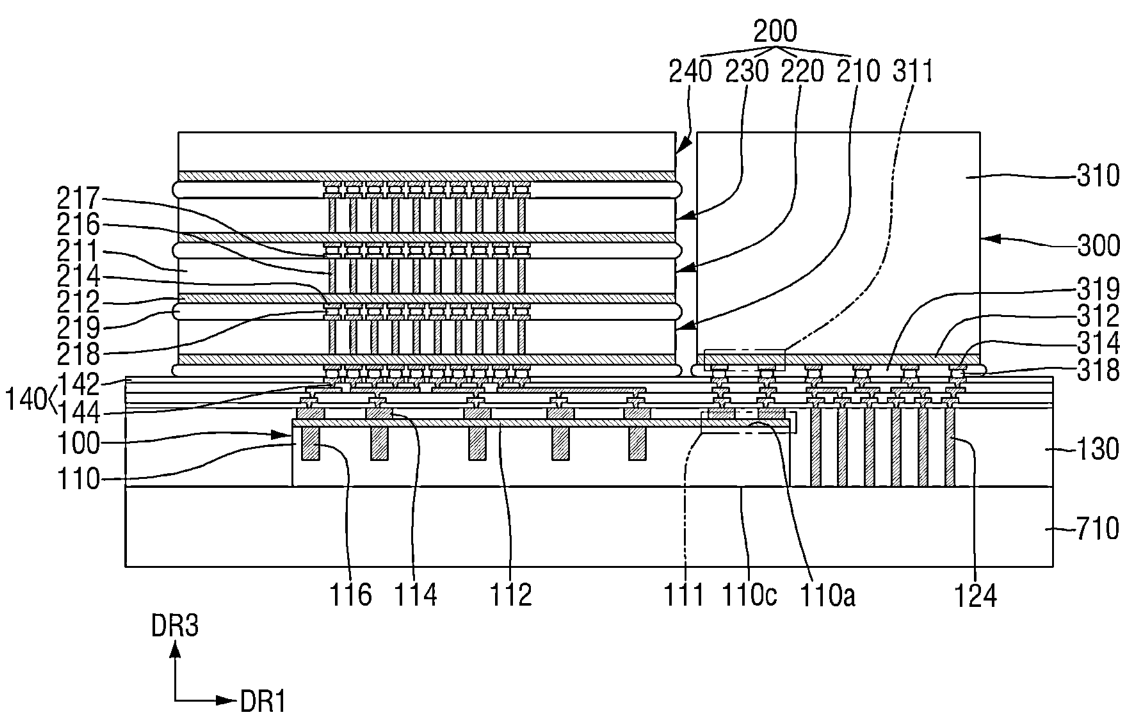

Referring to FIG. 13, a chip stack 200 and a second semiconductor chip 300 may be mounted on the first redistribution layer 140. The chip stack 200 and the second semiconductor chip 300 may be formed on the first redistribution layer 140 and spaced apart from each other.

The chip stack 200 may include a plurality of first semiconductor chips 210, 220, 230, and 240. The chip stack 200 may be formed on the first redistribution layer 140 such that a first semiconductor element layer 212 of each of the first semiconductor chips 210, 220, 230, and 240 faces toward the first redistribution layer 140.

The second semiconductor chip 300 may be formed on the first redistribution layer 140 such that a second semiconductor element layer 312 faces toward the first redistribution layer 140. The second semiconductor chip 300 may be formed on the first redistribution layer 140 such that a second physical region 311 overlaps at least a portion of a physical region of the buffer chip 100 in the third direction DR3.

Figure 14:
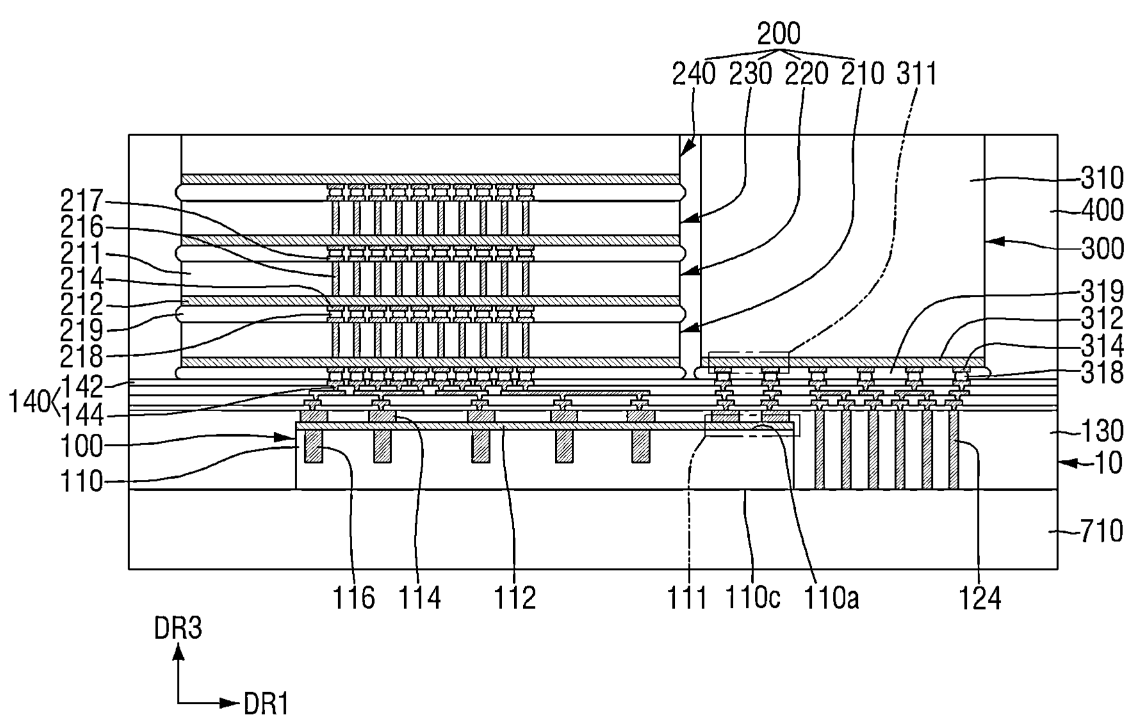

Referring to FIG. 14, a second molding layer 400 may be formed on the first redistribution layer 140. The second molding layer 400 may cover the first redistribution layer 140, the chip stack 200, and the second semiconductor chip 300. The second molding layer 400 may fill a space between the chip stack 200 and the second semiconductor chip 300. In some example embodiments, the second molding layer 400 may expose an upper surface in the third direction DR3 of the chip stack 200 and an upper surface in the third direction DR3 of the second semiconductor chip 300.

Figure 15:
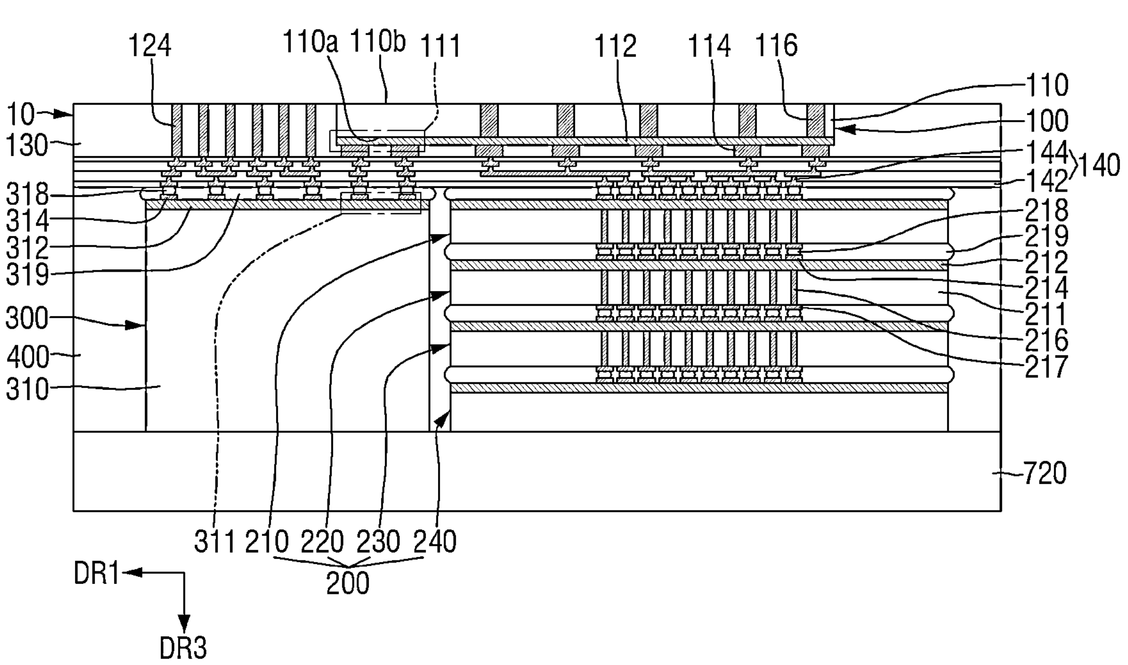

Referring to FIG. 15, the resulting layer of FIG. 14 may be formed on (e.g., attached to or disposed on) a second carrier substrate 720. The second carrier substrate 720 may be attached to the chip stack 200, the second semiconductor chip 300, and the second molding layer 400. The second carrier substrate 720 may include, for example, silicon, metal, glass, plastic, or ceramic.

The first carrier substrate 710 may be removed. Thus, the buffer chip 100, the second pillar 124, and the first molding layer 130 may be exposed. The third surface 110*c* of the buffer substrate 110 may be exposed. The buffer chip 100, the second pillar 124, and the first molding layer 130 may be removed until the through electrode 116 is exposed. For example, portions of the buffer chip 100, the second pillar 124, and the first molding layer 130 may be removed by a grinding process such as a chemical mechanical polishing (CMP) process. Accordingly, the buffer substrate 110 may include a first surface 110*a* and a second surface 110*b* that are opposed to each other.

Thereafter, referring to FIG. 2, the second redistribution layer 150 may be formed on the second surface 110*b* of the buffer substrate 110. Accordingly, the buffer structure 10 may be formed.

The second redistribution layer 150 may include a plurality of second interlayer insulating films 152 and a plurality of second wiring patterns 154. The second redistribution layer 150 may be formed by repeatedly performing a process of forming and patterning the second interlayer insulating film 152 on the first molding layer 130 and a process of forming the second wiring pattern 154 within the patterned second interlayer insulating film 152. Accordingly, the second wiring pattern 154 may include a second wiring and a second via connected to the second wiring, and a width of the second via may decrease toward the buffer chip 100.

Then, the connection terminal 180 may be formed on the second redistribution layer 150. The connection terminal 180 may be in contact with the second wiring patterns 154. The connection terminal 180 may be electrically connected to the second wiring patterns 154.

Thereafter, the second carrier substrate 720 may be removed.

While the present disclosure has been particularly shown and described with reference to some example embodiments thereof and using specific terms, these example embodiments are provided so that this disclosure will fully convey the inventive concepts of the present disclosure, and not for purposes of limitation. Thus, it will be obvious to one of ordinary skill in the art that various changes and other equivalents may be made therein. Therefore, the scope of the present disclosure is defined not by the detailed description of the present disclosure but by the appended claims.

What is claimed:

1. A semiconductor package comprising:

a buffer structure comprising a first redistribution layer, a first buffer chip on the first redistribution layer, a second redistribution layer on the first buffer chip, and a first molding layer filling between the first redistribution layer and the second redistribution layer; and a first chip stack and a first semiconductor chip on the buffer structure and spaced apart from each other in a first direction parallel to an upper surface of the buffer structure, a bottom surface of the first chip stack being coplanar with a bottom surface of the first semiconductor chip;

a first underfill layer between the first chip stack and the buffer structure, the first underfill layer in contact with the first chip stack and the buffer structure; and a second underfill layer between the first semiconductor chip and the buffer structure, the second underfill layer in contact with the first semiconductor chip and the buffer structure, wherein the first buffer chip overlaps at least a portion of the first semiconductor chip in a first second direction from the buffer structure toward the first semiconductor chip.

2. The semiconductor package of claim 1, wherein the first buffer chip comprises a first physical region, the first semiconductor chip comprises a second physical region that overlaps at least a portion of the first physical region in the first-second direction, and the semiconductor package is configured to transmit and receive a signal between the first buffer chip and the first semiconductor chip through the first physical region and the second physical region.

3. The semiconductor package of claim 2, wherein the first physical region faces the first redistribution layer and the second physical region faces the first-second redistribution layer.

4. The semiconductor package of claim 1, wherein a width of the first buffer chip is smaller than a width of the first chip stack.

5. The semiconductor package of claim 1, further comprising:

a pillar penetrating through the first molding layer, the pillar electrically connected to the first redistribution layer and the second redistribution layer.

6. The semiconductor package of claim 5, wherein the first semiconductor chip overlaps the pillar in the first-second direction.

7. The semiconductor package of claim 1, further comprising:

a second chip stack spaced apart from the first chip stack and the first semiconductor chip on the buffer structure, wherein the buffer structure further comprises a second buffer chip spaced apart from the first buffer chip on the second redistribution layer, the first chip stack overlaps at least a portion of the first buffer chip in the first second direction, and the second chip stack overlaps at least a portion of the second buffer chip in the first-second direction.

8. The semiconductor package of claim 7, wherein the second buffer chip overlaps at least a portion of the first semiconductor chip in the first second direction.

9. The semiconductor package of claim 1, wherein the first redistribution layer comprises a first interlayer insulating film and a first via and a first wiring that are within the first interlayer insulating film, the second redistribution layer comprises a second interlayer insulating film and a second via and a second wiring that are within the second interlayer insulating film, and a width of the first via and a width of the second via decrease toward the first buffer chip.

10. The semiconductor package of claim 1, further comprising:

chip connection terminals including a first set of the chip connection terminals between the buffer structure and the first chip stack and a second set of the chip connection terminals between the buffer structure and the first semiconductor chip.

11. The semiconductor package of claim 1, wherein the first chip stack comprises a plurality of semiconductor chips and chip connection terminals between the plurality of semiconductor chips.

12. A semiconductor package comprising:

a buffer structure comprising a buffer chip comprising a buffer substrate including a first surface and a second surface, the buffer chip including a semiconductor element layer on the first surface of the buffer substrate, the first surface and the second surface being opposed to each other in a first direction, a first redistribution layer on the semiconductor element layer, a second redistribution layer on the second surface of the buffer substrate, a first molding layer filling between the first redistribution layer and the second redistribution layer;

a chip stack and a first semiconductor chip spaced apart from each other on the first redistribution layer in a second direction parallel to an upper surface of the buffer structure, a bottom surface of the chip stack being coplanar with a bottom surface of the first semiconductor chip;

a first underfill layer between the chip stack and the buffer structure, the first underfill layer in contact with the chip stack and the buffer structure; and a second underfill layer between the first semiconductor chip and the buffer structure, the second underfill layer in contact with the first semiconductor chip and the buffer structure.

13. The semiconductor package of claim 12, further comprising:

a first pillar penetrating through the first molding layer and being electrically connected to the first redistribution layer; and a second pillar penetrating through the first molding layer and being electrically connected to the first redistribution layer and the second redistribution layer.

14. The semiconductor package of claim 13, wherein the first pillar and second pillar are in contact with the first redistribution layer.

15. The semiconductor package of claim 12, wherein the buffer chip overlaps at least a portion of the first semiconductor chip and at least a portion of the chip stack in the first direction.

16. The semiconductor package of claim 12, wherein the chip stack comprises a plurality of semiconductor chips, and a width of the buffer chip is smaller than a width of the chip stack.

17. The semiconductor package of claim 12, wherein an upper surface of the chip stack is coplanar with an upper surface of the first semiconductor chip.

18. A semiconductor package comprising:

a package substrate;

a buffer structure comprising a first redistribution layer on the package substrate, a buffer chip on the first redistribution layer, the buffer chip comprising a buffer substrate including a first surface and a second surface, the buffer chip including a semiconductor element layer on the second surface of the buffer substrate, the semiconductor element layer comprising a first physical region, the first surface and the second surface being opposed to each other in a first direction, a second redistribution layer on the semiconductor element layer, a first molding layer filling between the first redistribution layer and the second redistribution layer;

a first pillar penetrating through the first molding layer, the first pillar electrically connecting the buffer chip to the second redistribution layer, and a second pillar penetrating through the first molding layer, the second pillar connecting the first redistribution layer to the second redistribution layer;

a first semiconductor chip on the second redistribution layer, the first semiconductor chip comprising a second physical region;

a chip stack on the second redistribution layer, the chip stack spaced apart from the first semiconductor chip in a second direction parallel to an upper surface of the package substrate, a bottom surface of the chip stack being coplanar with a bottom surface of the first semiconductor chip;

a first underfill layer between the chip stack and the buffer structure, the first underfill layer in contact with the chip stack and the buffer structure;

a second underfill layer between the first semiconductor chip and the buffer structure, the second underfill layer in contact with the first semiconductor chip and the buffer structure; and a second molding layer on the second redistribution layer, the second molding layer configured to cover at least portions of the chip stack and the first semiconductor chip, wherein the first physical region overlaps at least a portion of the second physical region in the first direction, and the semiconductor package is configured to transmit and receive a signal between the buffer chip and the first semiconductor chip through the first physical region and the second physical region.

19. The semiconductor package of claim 18, further comprising:

a heat dissipation member on the package substrate, the heat dissipation member configured to cover the chip stack and the first semiconductor chip.

20. The semiconductor package of claim 20 wherein the first pillar includes a same material as that of the second pillar.

* * * * *